(12) United States Patent
Brinlee

(10) Patent No.: US 11,552,631 B2
(45) Date of Patent: Jan. 10, 2023

(54) VOLTAGE COMPARATOR

(71) Applicant: FLEXTRONICS AP, LLC, San Jose, CA (US)

(72) Inventor: Antony E. Brinlee, Plano, TX (US)

(73) Assignee: FLEXTRONICS AP, LLC, San Jose, CA (US)

( * ) Notice: Subject to any disclaimer, the term of this patent is extended or adjusted under 35 U.S.C. 154(b) by 0 days.

(21) Appl. No.: 17/395,601

(22) Filed: Aug. 6, 2021

(65) Prior Publication Data
US 2021/0367592 A1 Nov. 25, 2021

Related U.S. Application Data

(63) Continuation of application No. 17/009,137, filed on Sep. 1, 2020, now Pat. No. 11,088,687, which is a
(Continued)

(51) Int. Cl.
H03K 5/22 (2006.01)
H03K 3/037 (2006.01)
(Continued)

(52) U.S. Cl.
CPC ...... *H03K 17/165* (2013.01); *H02M 3/33592* (2013.01); *H03K 3/012* (2013.01); *H03K 3/02337* (2013.01); *H03K 17/0822* (2013.01); *H03K 17/145* (2013.01); *H03K 17/687* (2013.01); *H03K 17/14* (2013.01); *H03K 17/18* (2013.01); *H03K 17/691* (2013.01); *H03K 2217/0027* (2013.01); *H03K 2217/0036* (2013.01); *Y02B 70/10* (2013.01)

(58) Field of Classification Search
None
See application file for complete search history.

(56) References Cited

U.S. PATENT DOCUMENTS 3,471,714 A * 10/1969 Wells ................ H03G 11/002
327/363
3,772,606 A * 11/1973 Waehner ................ H03F 3/42
330/297

(Continued)

FOREIGN PATENT DOCUMENTS

EP 2323244 A2 5/2011

OTHER PUBLICATIONS

Maxim Design Support Technical Documents Application Notes Amplifier and Comparator Circuits APP 3616 "Adding Extra Hysteresis to Comparators", Sep. 19, 2005 (Sep. 19, 2005, pp. 1-9, XP055197212, Retrieved from the Internet: URL:http://pdfserv.maximintegrated.com/en/an/AN3616.pdf [retrieved on Jun. 22, 2015].

*Primary Examiner* — Kenneth B Wells
(74) *Attorney, Agent, or Firm* — Volpe Koenig

(57) ABSTRACT

A circuit arrangement is disclosed for controlling the switching of a field effect transistor (FET). A current controlled amplifier may be configured to amplify a current in a current sense device to generate an amplified current, wherein the current in the current sense device indicates a current through the FET. A comparator may be coupled to the current sense amplifier to compare a voltage corresponding to the amplified current with a voltage reference and to generate a comparator output based on the comparison, wherein the comparator output controls whether the FET is on or off.

15 Claims, 8 Drawing Sheets

Related U.S. Application Data continuation of application No. 16/781,097, filed on Feb. 4, 2020, now Pat. No. 10,763,850, which is a continuation of application No. 16/290,051, filed on Mar. 1, 2019, now Pat. No. 10,554,205, which is a continuation of application No. 15/918,234, filed on Mar. 12, 2018, now Pat. No. 10,224,926, which is a continuation of application No. 15/292,643, filed on Oct. 13, 2016, now Pat. No. 9,917,576, which is a continuation of application No. 14/553,108, filed on Nov. 25, 2014, now Pat. No. 9,473,132.

(60) Provisional application No. 61/908,583, filed on Nov. 25, 2013.

(51) Int. Cl.

| | | |
|---|---|---|
| *H02M 1/32* | (2007.01) | |
| *H02M 3/158* | (2006.01) | |
| *H03K 17/16* | (2006.01) | |
| *H02M 3/335* | (2006.01) | |
| *H03K 17/082* | (2006.01) | |
| *H03K 3/012* | (2006.01) | |
| *H03K 17/687* | (2006.01) | |
| *H03K 3/0233* | (2006.01) | |
| *H03K 17/14* | (2006.01) | |
| *H03K 17/18* | (2006.01) | |
| *H03K 17/691* | (2006.01) | |

(56) References Cited

U.S. PATENT DOCUMENTS

| | | | |
|---|---|---|---|
| 3,866,063 A * | 2/1975 | Long | H03D 1/18 330/257 |
| 3,922,614 A * | 11/1975 | van de Plassche | H03F 3/45071 330/288 |
| 4,194,165 A * | 3/1980 | Skulski | H03F 1/34 381/104 |
| 4,428,008 A * | 1/1984 | Fawkes | H03K 17/6877 |
| 4,679,092 A * | 7/1987 | Blanken | H04N 5/59 327/317 |
| 4,703,390 A | 10/1987 | Fay et al. | |
| 4,814,724 A | 3/1989 | Tanigawa | |
| 4,864,155 A * | 9/1989 | Schmitz | H03G 3/348 360/60 |
| 5,061,863 A | 10/1991 | Mori et al. | |
| 5,175,489 A | 12/1992 | Mizuide | |
| 5,504,448 A | 4/1996 | Bennett et al. | |
| 5,519,341 A | 5/1996 | Corsi et al. | |
| 5,877,617 A | 3/1999 | Ueda | |
| 5,982,201 A * | 11/1999 | Brokaw | H03F 3/3432 327/541 |
| 6,107,884 A * | 8/2000 | Gorcea | H03F 1/3217 330/296 |
| 6,677,807 B1 * | 1/2004 | Brokaw | G05F 3/265 323/316 |
| 6,831,514 B2 * | 12/2004 | Waller, Jr. | H03F 1/3217 330/289 |
| 7,626,792 B2 | 12/2009 | Mitsuda | |
| 8,300,510 B1 * | 10/2012 | Dean | G11B 7/1263 369/53.26 |
| 8,953,342 B2 | 2/2015 | Fang | |
| 9,184,668 B2 | 11/2015 | Telefus | |
| 9,413,246 B2 | 8/2016 | Luo et al. | |
| 9,724,528 B2 | 8/2017 | Boone et al. | |
| 2009/0295348 A1 | 12/2009 | Tao et al. | |
| 2011/0133790 A1 | 6/2011 | Nagata et al. | |
| 2014/0084994 A1 | 3/2014 | Merkin et al. | |

* cited by examiner

VOLTAGE COMPARATOR

CROSS REFERENCE TO RELATED APPLICATION

This application is a continuation of U.S. patent application Ser. No. 17/009,137, filed Sep. 1, 2020, which issued as U.S. Pat. No. 11,088,687 on Aug. 10, 2021, which is a continuation of U.S. patent application Ser. No. 16/781,097, filed Feb. 4, 2020, which issued as U.S. Pat. No. 10,763,850, on Sep. 1, 2020, which is a continuation of U.S. patent application Ser. No. 16/290,051, filed Mar. 1, 2019, which issued as U.S. Pat. No. 10,554,205 on Feb. 4, 2020, which is a continuation of U.S. patent application Ser. No. 15/918,234, filed Mar. 12, 2018, which issued as U.S. Pat. No. 10,224,926 on Mar. 5, 2019, which is a continuation of U.S. patent application Ser. No. 15/292,643, filed Oct. 13, 2016, which issued as U.S. Pat. No. 9,917,576 on Mar. 13, 2018, which is a continuation of U.S. patent application Ser. No. 14/553,108, filed Nov. 25, 2014, which issued as U.S. Pat. No. 9,473,132 on Oct. 18, 2016, which claims the benefit of U.S. Provisional Application Ser. No. 61/908,583, filed Nov. 25, 2013, the contents of which are hereby incorporated by reference herein.

FIELD OF INVENTION

The disclosure relates to the control of a switch. More particularly, the disclosure relates to the control of a synchronous field effect transistor (FET).

BACKGROUND

Synchronous (sync) FET controllers traditionally control the sync FET in the voltage domain. A traditional sync FET controller senses a forward Vf voltage drop of a body diode of the sync FET to determine a point at which to turn on the sync FET. The sync FET further senses a voltage across the Rds_on of the sync FET to determine a point at which to turn off the sync FET.

A voltage controlled amplifier (VCA) may amplify a voltage across the Rds_on of the MOSFET, and the amplified voltage may then be used to control when to turn off the sync FET. Sensing and controlling the sync FET in the voltage domain is susceptible to influences due to parasitic inductors (L's) and capacitors (C's) of the circuit layout and the parts involved. The influence of the parasitic L's and C's may degrade the ability to accurately control the switching on and off of the sync FET.

Voltage domain sync FET control may be inaccurate when sensing signals which have a high change in current vs. time (dI/dt), such as near the zero crossing of an LLC waveform. Parasitic L's and C's in combination with the high dI/dt can cause cross conduction due to propagation delays in the VCA. At light loads, when the traditional sync FET controller senses the forward Vf of the body diode to turn on the sync FET and Rds on to turn off the sync FET, the traditional sync FET control may operate inefficiently. In the load light load condition, after the traditional controller turns on the sync FET based on the forward Vf of the body diode, the controller may then quickly turn off the sync FET based on the voltage detected across the Rds_on of the sync FET being at or below a turn-off threshold. As such, the traditional sync FET controller introduces additional losses due to the unintentional switching of the sync FET plus the loss from the body diode without the benefit of using the low Rds_on of the sync FET.

Thus, there exists a need for a more accurate and efficient sync FET controller.

SUMMARY

A sync FET controller is disclosed which uses current domain control to effect high speed control of the turn on/off points for the gate drive of the sync FET controller. The sync FET controller may use the copper on the printed circuit board (PCB) or a shunt resistor as a current sense element to sense the current flowing between output capacitors and a transformer. The thermal drift of the copper on the PCB may also be compensated. A method and circuit arrangement is disclosed for setting the gain and turn on/off points of the sync FET controller. Further, a method and circuit arrangement is disclosed for providing a wakeup pulse from a secondary side back to a primary side for deep sleep modes of operation.

DETAILED DESCRIPTION OF THE PREFERRED EMBODIMENTS

Figure 1:
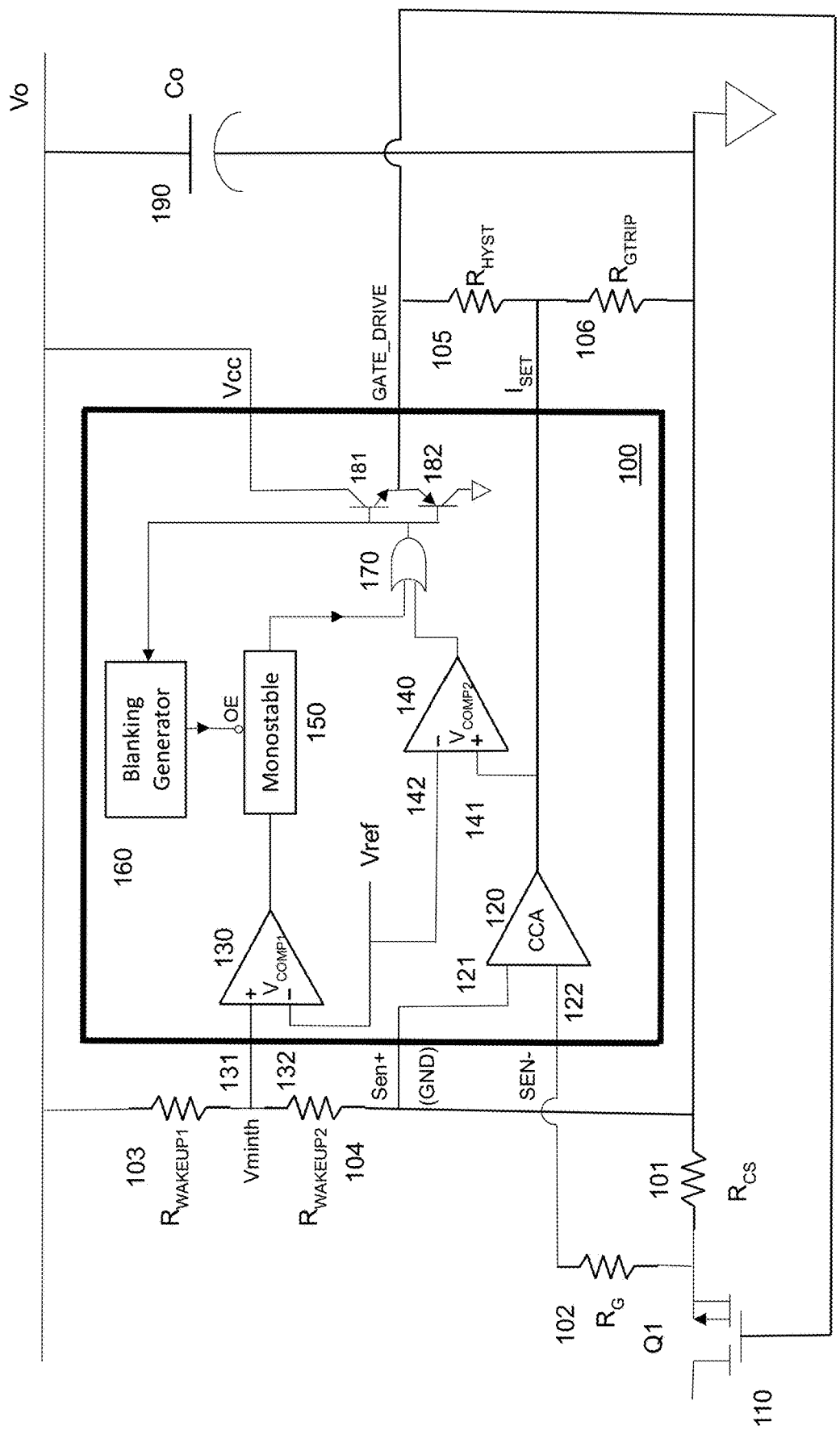
FIG. 1 depicts an example embodiment of a controller.

Disclosed herein is a controller of a switch that may be used, for example, in discontinuous conduction mode (DCM) power converters. The switch may be a FET in a DCM power converter. Examples of power converters in which the controller may be used include, but are not limited to, a quasi-resonant (QR) converter, a QR flyback converter, and an LLC power converter. In said converters, the FET may be switched on and off to effect the conversion of power from the input to the output An example embodiment of an FET controller 100 is depicted in FIG. 1. The FET may be a switch Q1 110, wherein a gate of the switch Q1 110, which determines whether the switch is closed/on or open/off, is controlled by the GATE_DRIVE. The switch Q1 110 may comprise a metal oxide semiconductor (MOS) FET, which may be an NMOS FET or PMOS FET. The switch may alternatively be another type of transistor, such as a bipolar transistor.

The switch Q1 110 may be coupled between a secondary side of a transformer (not depicted) and an output capacitor Co 190. The output capacitor Co 190 may store a charge at the output of a power converter. When the switch is closed/on, a current may flow through the switch Q1 110 to charge the output capacitor Co 190. The timing of the switching of the switch Q1 110 between being closed/on and open/off may control the conversion of power into stored energy/ charge in the output capacitor Co 190 for delivery to a load. A voltage Vo may be built up across the output capacitor Co 190.

In an embodiment of a controller 100 configured in accordance with the teachings herein, the controller 100 may include a current controlled amplifier (CCA) 120. The CCA 120 may include two inputs, for example a negative current input SEN− 122 and a positive current input SEN+ 121 as depicted in FIG. 1. The CCA 120 may take a differential current between the two current inputs and amplify the differential current by a current gain to generate an amplified current output. The CCA 120 may further comprise a plurality of current controlled amplifiers. The inputs may be coupled to the switch Q1 110 or to a current sense device $R_{CS}$ 101 to sense a current flowing through the switch Q1 110.

The current sense device $R_{CS}$ 101 may be coupled to the switch Q1 110. Current sense device $R_{CS}$ 101 as depicted in FIG. 1 may comprise a shunt resistor or a copper trace coupled to the switch Q1 110. The current input SEN− 122 may be coupled to a first node of the current sense device $R_{CS}$ 101 via a resistor $R_G$ 102. The current input SEN+ 121 may be coupled to a second node of the current sense device $R_{CS}$ 101. The second node may be the ground node of the power converter or may be another power supply node. The CCA 120 may have, for example, a current gain of approximately 1000. The current gain of the CCA 120 may be controllable to tune a turn-on point at which the switch Q1 110 is turned on and to tune a turn-off point at which the switch Q1 110 is turned off. The CCA 120 may be, for example, a modified Wilson current amplifier, but the CCA 120 is not limited to any particular topology. Biasing may be added to the Wilson current amplifier to improve its speed.

In an embodiment of a controller 100 configured in accordance with the teachings herein, wherein the current sense device $R_{CS}$ 101 is a copper trace, temperature compensation may be implemented to compensate for a drift in the resistance of the copper trace due to a change in operating temperature. A drift in an explicit resistance may also be compensated. A negative temperature coefficient (NTC), a positive temperature coefficient (PTC), a PN junction, or any combination thereof may be used to compensate for said resistance drift. Furthermore, a voltage controlled current may be sunk from an appropriate node or sourced to the appropriate node to compensate for changes in the resistance due to a change in temperature. Additionally or alternatively, a voltage may be modified to compensate for changes in the resistance due to a change in temperature. Placement of the components configured to perform temperature compensation may be dependent upon the particular topology implemented. Examples of compensation configurations will be described in more detail below.

In an embodiment of a controller 100 configured in accordance with the teachings herein, a resistance $R_{GTRIP}$ 106 may be coupled to the output of the CCA 120. The output of the CCA 120 may be further coupled to first input 141 of a voltage comparator $V_{COMP2}$ 140. A voltage reference Vref may be coupled to a second input 142 of the voltage comparator $V_{COMP2}$ 140. The resistor $R_{GTRIP}$ 106 may be sized to set a current output from the CCA 120 at which the voltage comparator $V_{COMP2}$ 140 turns on. This turn-on current may be referred to as $I_{SET}$ as depicted in FIG. 1. The CCA 120 current output flowing through resistor $R_{GTRIP}$ 106 may induce a voltage at the first input 141 of the voltage comparator $V_{COMP2}$ 140. When the induced voltage at the first input 141 exceeds Vref, the output of the voltage comparator $V_{COMP2}$ 140 may turn on. The voltage comparator $V_{COMP2}$ 140 may alternatively be configured to operate such that when the induced voltage at the first input is less than Vref the output of the voltage comparator turns on.

In an embodiment of a controller 100 configured in accordance with the teachings herein, the output of the controller GATE_DRIVE may be coupled through a resistance $R_{HYST}$ 105 to the first input 141 to create a hysteresis band around the voltage comparator $V_{COMP2}$ 140 to set a turn-off point of the voltage comparator $V_{COMP2}$ 140. Alternatively, the voltage comparator $V_{COMP2}$ 140 may be configured by a separate turn-off point.

In an embodiment of a controller 100 configured in accordance with the teachings herein, gate drive circuitry may be coupled between the output of the voltage comparator and a gate of the switch Q1 110. FIG. 1 depicts an example of gate drive circuitry including an example driving transistor pair of a PNP 182 and NPN transistor 181.

In an embodiment of a controller 100 configured in accordance with the teachings herein, the controller 100 may include circuitry configured to enable the controller 100 to enter into a deep sleep operation mode during light or no load conditions. In the deep sleep mode, the controller 100 may shut down the gate drive circuitry and other unused digital circuitry that may be draining power. In deep sleep mode, the primary side of the converter may also enter a sleep mode which may also save power by shutting down unused circuitry on the primary side of the transformer. The controller 100 may further include circuitry configured to generate a wake-up pulse to the primary side in response to an increase in a load demand or in response to an output voltage dropping to a minimum threshold voltage. The ability to provide the wake-up pulse may reduce a quantity of parts needed to implement the converter and may also improve a load step response.

As depicted in FIG. 1, resistors $R_{WAKEUP1}$ 103 and $R_{WAKEUP2}$ 104 may be configured as a voltage divider to set Vminth, which is a function of the output voltage, for triggering a wake-up pulse. The voltage comparator $V_{COMP1}$ 130 may compare the threshold voltage Vminth at a first input 131 to a reference voltage Vref coupled to a second input 132. When Vminth drops below Vref, the voltage comparator $V_{COMP1}$ 130 may turn on to trigger a monostable 150, which may also be known as a one-shot, to deliver a pulse to drive the GATE_DRIVE. The GATE_DRIVE may then cause switch Q1 110 to pulse by switching on and off. The generated pulse may be fed back to the primary side of the power converter through the transformer which may be detected, for example, by an auxiliary winding on the transformer to wake up the primary side. The primary side may then cause the secondary side, including the controller 100, to wake up and return to synchronously switching the switch Q1 110. The circuitry for generating the wake-up pulse may be enabled or disabled and may be, for example, enabled by default. More details regarding the operation of the wake-up circuitry will be provided below. Furthermore, FIG. 1 depicts a Blanking Generator 160 coupled to the monostable 150, the function of which will be described in detail below. Though the controller 100 depicted in FIG. 1 shows wake-up circuitry including $V_{COMP1}$ 130, $R_{WAKEUP1}$ 103, $R_{WAKEUP2}$ 104, monostable 150, Blanking Generator 160, and an OR gate 170, such circuitry may also be left out of a controller 100 so that the wake-up feature is not implemented.

The configuration of the CCA 120 and the voltage comparator $V_{COMP2}$ 140 enables accurate sensing of low currents in the switch Q1 110. The configuration may be further capable of high speed control of the switching of the switch Q1 110. Such high speed control may be a direct benefit of amplifying in the current domain via the CCA 120 up until the voltage comparator $V_{COMP2}$ 140, in contrast to amplification in the voltage domain performed by traditional controllers. By amplifying in the current domain, the controller 100 is less susceptible to parasitic inductances and capacitance that may slow response time and induce ringing which may impede accurate control of the switch Q1 110. The turn-on/turn-off points and hysteresis of the controller 100 may be adjustable so that a propagation delay from sensing current to a drain on the switch Q1 110 may be minimized and losses associated with the forward Vf of the switch Q1 110 may also be minimized.

The disclosed configuration of the CCA 120 and the voltage comparator $V_{COMP2}$ 140 may enable turning on and off the switch at lower levels so that the switch may conduct current during more of a total switching period than conventional means, thus reducing losses caused by body diodes. Furthermore, the controller 100 may exhibit improved low or no load efficiency because the controller 100 may not rely upon Rds_on like conventional controllers which causes conventional controllers to inefficiently turn on and off repeatedly in such low or no load conditions.

In an embodiment of a controller 100 configured in accordance with the teachings herein, the controller 100 may include gate drive limiting circuitry configured to selectively limit an output of the voltage comparator $V_{COMP2}$ 140 and/or gate drive circuitry. The output may be limited to a selected voltage, for example the output may be limited to either 5 volts or 10 volts.

In an embodiment of a controller 100 configured in accordance with the teachings herein, the controller 100 may include under voltage lockout (UVLO) circuitry to sense a supply voltage. The UVLO circuitry may prevent operation of the controller 100 when the supply voltage drops below a selectable threshold. For example, the threshold may be selected to be 4 volts or 9 volts. The UVLO circuitry may be enabled or disabled and may be, for example, enabled by default.

A controller 100 configured in accordance with the teachings herein may be manufactured in a small package, for example an SOT23-6 package. The small package may enable the controller 100 to be implemented in systems with tight size and space requirements.

The principles disclosed herein may be applied generally to current sensing applications to eliminate current sensing resistors. For example, the CCA 120 and voltage comparator $V_{COMP2}$ 140 arrangement such as that depicted in FIG. 1 and described above may be used to sense inputs for a pulse width modulation (PWM) controller for a power factor correction (PFC) stage. The current sensing topology may also be applied to other DC/DC conversion applications or as part of an over-current detector.

Although the resistances in FIG. 1 are depicted as explicit resistors, one should recognize that any suitable component may be used which provides a resistance. For example, a depicted resistor may be replaced by a suitable bipolar transistor, FET transistor, diode, capacitor, inductor, or any combination thereof. Furthermore, the depicted resistances may be external resistances or may be incorporated within the controller package. Furthermore, although FIG. 1 may depict the controller 100 coupled to ground and to a single positive voltage supply, the controller 100 may be alternatively or additionally coupled to one or more positive voltage supplies and/or one or more negative voltage supplies. Moreover, one should recognize that the controller configuration may further include additional circuitry such as buffers and additional connections to external circuitry based on the particular implementation.

Although the controller 100 depicted in FIG. 1 is configured with a switch Q1 110 coupled to ground, and the CCA 120 is further coupled to the ground side to sense the current through the switch Q1 110, one of skill in the art should recognize that an inverted configuration such that the switch Q1 110 is coupled to Vo may also be possible. In such a configuration, a PMOS or a charge pump in combination with an NMOS may be coupled on the Vo side for a high-side switched sync FET controller arrangement. In such a high-side switched arrangement, the current may be sensed through the switch Q1 110 coupled to Vo and amplified by an appropriately inverted version of CCA 120 configured to sense and amplify said current.

Figure 2:
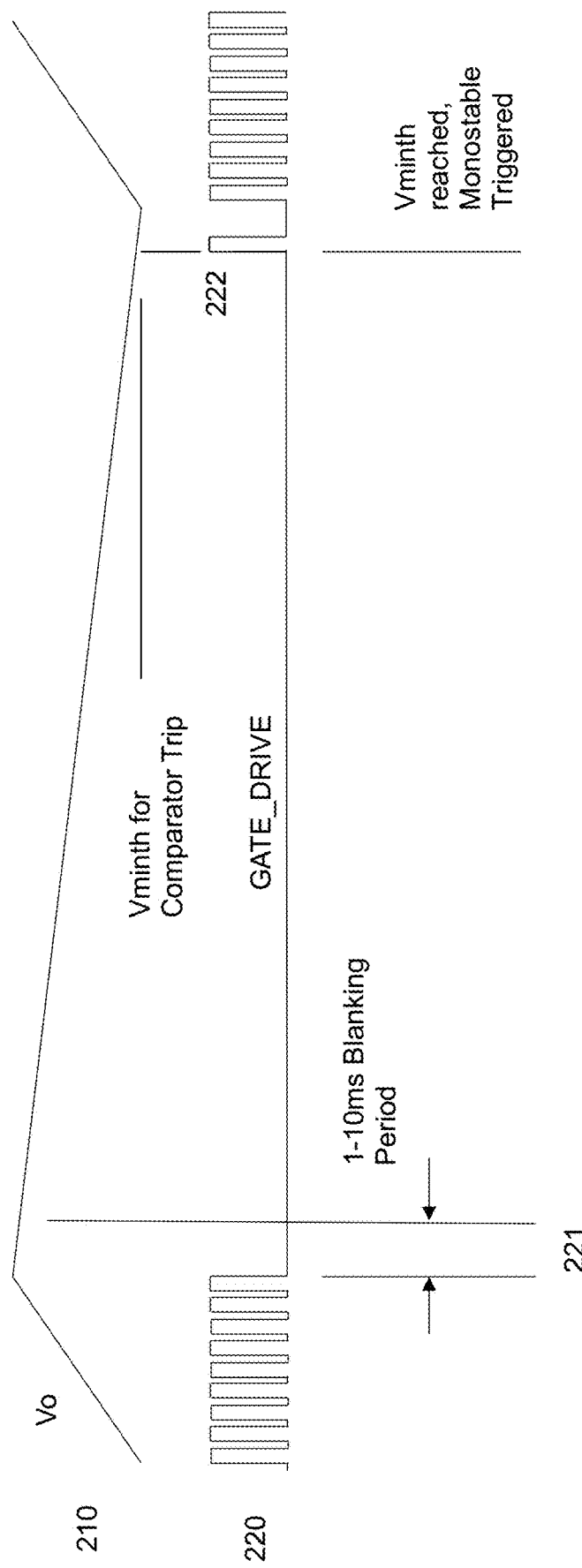
FIG. 2 depicts an example of waveforms that may be associated with the wake-up feature of an embodiment of a controller.

FIG. 2 depicts an example of waveforms that may be associated with the wake-up feature of an embodiment of the controller 100 described above. Vo may be an example output voltage across the output capacitor Co 190. This voltage Vo may also be referred to as Vcc. The GATE_DRIVE waveform may be a voltage waveform associated with the depicted Vo voltage waveform. The switching of the GATE_DRIVE may charge the output capacitor to the output voltage Vo. Once the output voltage Vo is fully charged and the switching stops in the GATE_DRIVE, a blanking period may be implemented such that the monostable 150, also known as a one-shot, may be disabled so that it cannot deliver a pulse during the blanking period. The Blanking Generator 160 depicted in FIG. 1 may be the circuitry coupled to the monostable 150 to prevent the monostable 150 from outputting a pulse during the blanking period. The Blanking Generator 160 may output an enable/disable signal to the monostable 150. The blanking period may be a programming period of, for example, 1 ms to 10 ms in length. The blanking period may ensure that the monostable 150 does not fire during a time that could effectively short the primary side to the secondary side.

As described with respect to FIG. 1, Vminth is a function of Vo through the voltage division of $R_{WAKEUP1}$ and $R_{WAKEUP2}$. When Vminth reaches Vref, voltage comparator $V_{COMP1}$ of FIG. 1 may cause the monostable 150 to deliver a pulse to the gate drive circuitry. As described above with respect to FIG. 1, the pulse from the monostable 150 may be then fed back to the primary side to wake-up the converter, at which point the switching of the GATE_DRIVE may recommence to recharge the output voltage Vo across the output capacitor Co 190.

Figure 3:
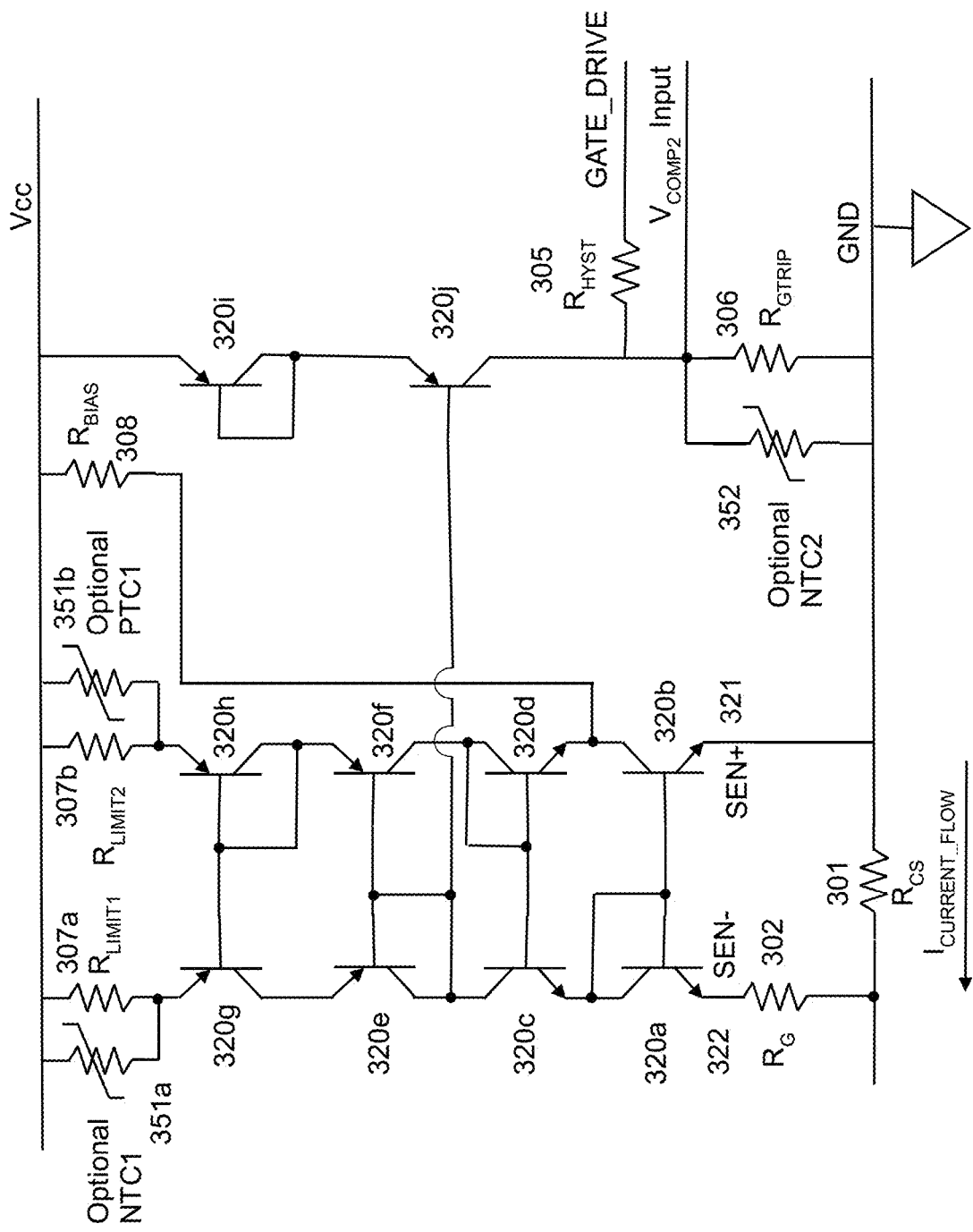
FIG. 3 depicts a schematic of an example current controlled amplifier (CCA) which may be used in an embodiment of a controller.
Figure 4:
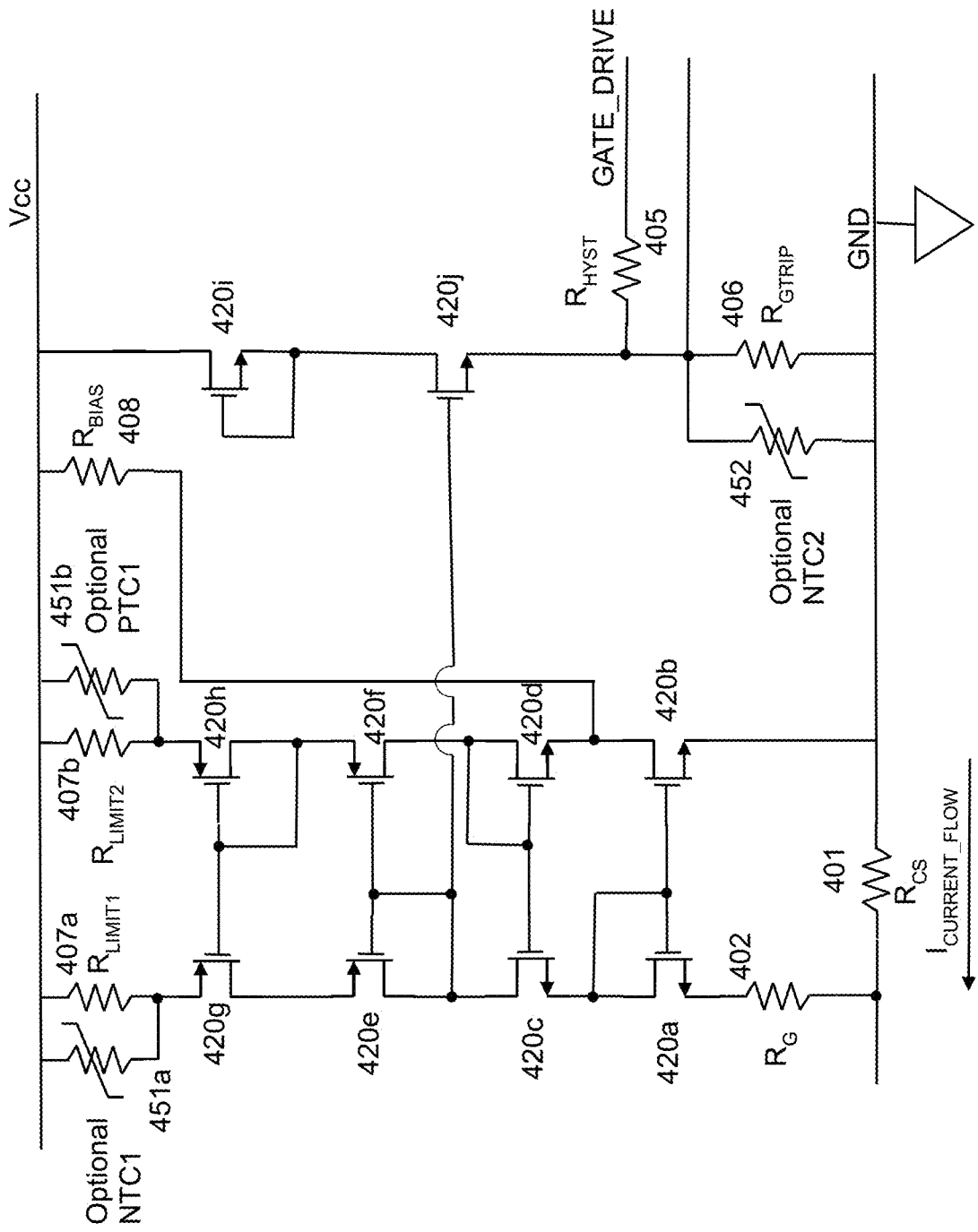
FIG. 4 depicts a schematic of another example CCA which may be used in an embodiment of a controller.

FIGS. 3 and 4 depict schematics of example CCA topologies which may be used as an implementation of the CCA 120 depicted in FIG. 1. FIG. 3 depicts a CCA implemented using bipolar transistors 320*a*-230*j* and FIG. 4 depicts a CCA implemented using FETs 420*a*-420*j*. The particular implementation of the CCA 120 in FIG. 1 is not limited to only the CCAs depicted in FIGS. 3 and 4. The resistances $R_G$ 302/402, $R_{CS}$ 301/401, $R_{HYST}$ 305/405, and $R_{GTRIP}$ 306/406 depicted in FIGS. 3 and 4 correspond with the similarly labeled resistances in FIG. 1. The depicted CCAs comprise a Wilson current amplifier further configured with voltage biasing through resistance $R_{BIAS}$ 308/408. FIGS. 3 and 4 further depict optional thermistors NTC1 351*a*/451*a*, PTC1 351*b*/451*b*, and NTC2 352/452. Any one thermistor or combination of these thermistors may be included to compensate for the change in resistance due to a change in temperature as described above with respect to FIG. 1. Although thermistors are depicted, a PN junction may be used. The effect of the changing resistance in the thermistor is to modify the voltage and current at the nodes to which it is coupled. As described above, additionally or alternatively a voltage controlled current may be sunk or sourced to compensate for changes in the resistance due to a change in temperature. Additionally or alternatively, a voltage may be modified to compensate for changes in the resistance due to a change in temperature.

Figure 5:
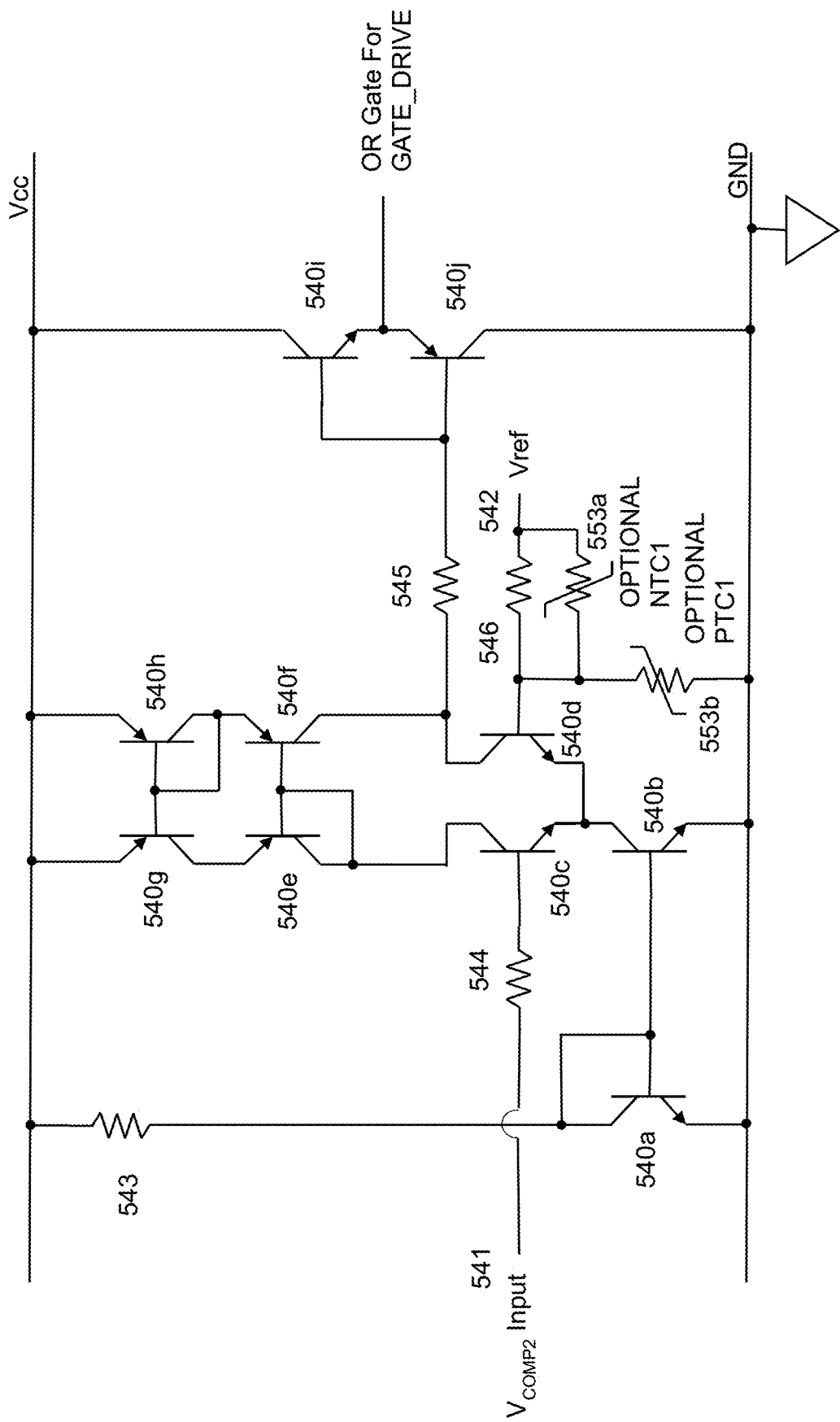
FIG. 5 depicts a schematic of an example implementation of a voltage comparator for gate drive generation.

FIG. 5 depicts a schematic of an example implementation of a voltage comparator for gate drive generation, such as the voltage comparator $V_{COMP2}$ 140 depicted in FIG. 1. The voltage comparator $V_{COMP2}$ 140 of FIG. 1 is not limited to the topology depicted in FIG. 5. The $V_{COMP2}$ input 541 depicted in FIG. 5 may serve as the positive input 141 of $V_{COMP2}$ 140 depicted in FIG. 1 coupled to the output of the CCA 120. The other input 542 of the voltage comparator depicted in FIG. 5 may serve as the negative input 142 of $V_{COMP2}$ 140 depicted in FIG. 1 coupled to Vref.

FIG. 5 further depicts optional thermistors NTC1 553a and PTC1 553b. Any one or combination of these thermistors may be included to compensate for the change in resistance due to a change in temperature as described above with respect to FIG. 1. Although thermistors are depicted, a PN junction may be used. The effect of the changing resistance in the thermistor is to modify the voltage and current at the nodes to which it is coupled. As described above, additionally or alternatively a voltage controlled current may be sunk or sourced to compensate for changes in the resistance due to a change in temperature. Additionally or alternatively, a voltage may be modified to compensate for changes in the resistance due to a change in temperature.

Figure 6:
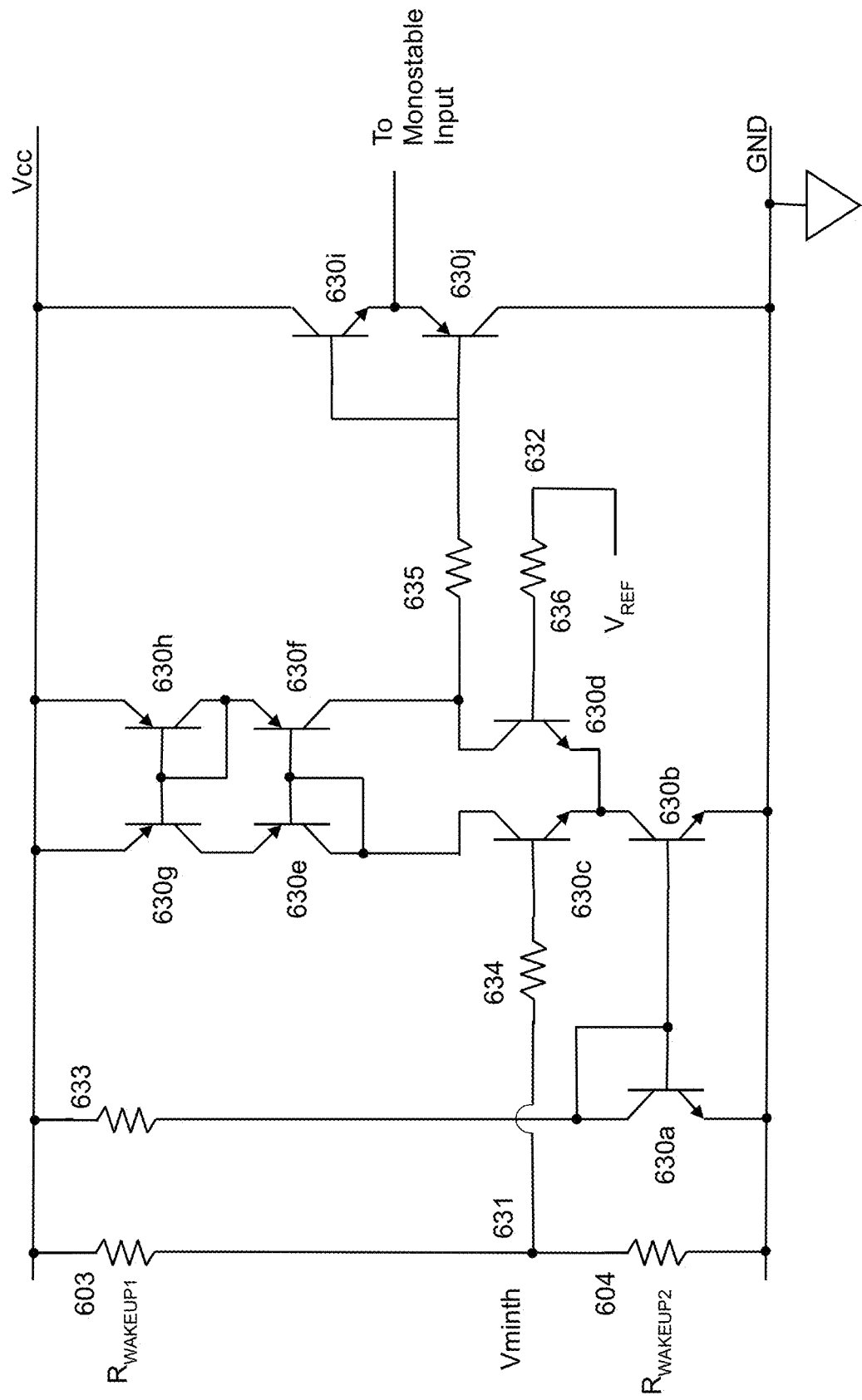
FIG. 6 depicts a schematic of an example implementation of a voltage comparator for a wake-up feature.

FIG. 6 depicts a schematic of an example implementation of a voltage comparator for the wake-up feature described above, such as the voltage comparator $V_{COMP1}$ 130 depicted in FIG. 1. The resistances $R_{WAKEUP1}$ 603 and $R_{WAKEUP2}$ 604 depicted in FIG. 6 correspond with the similarly labeled resistances in FIG. 1. As similarly shown in FIG. 1, Vminth may be coupled to the one input 631 of the voltage comparator depicted in FIG. 6, and Vref may be coupled to the other input 632.

Figure 7:
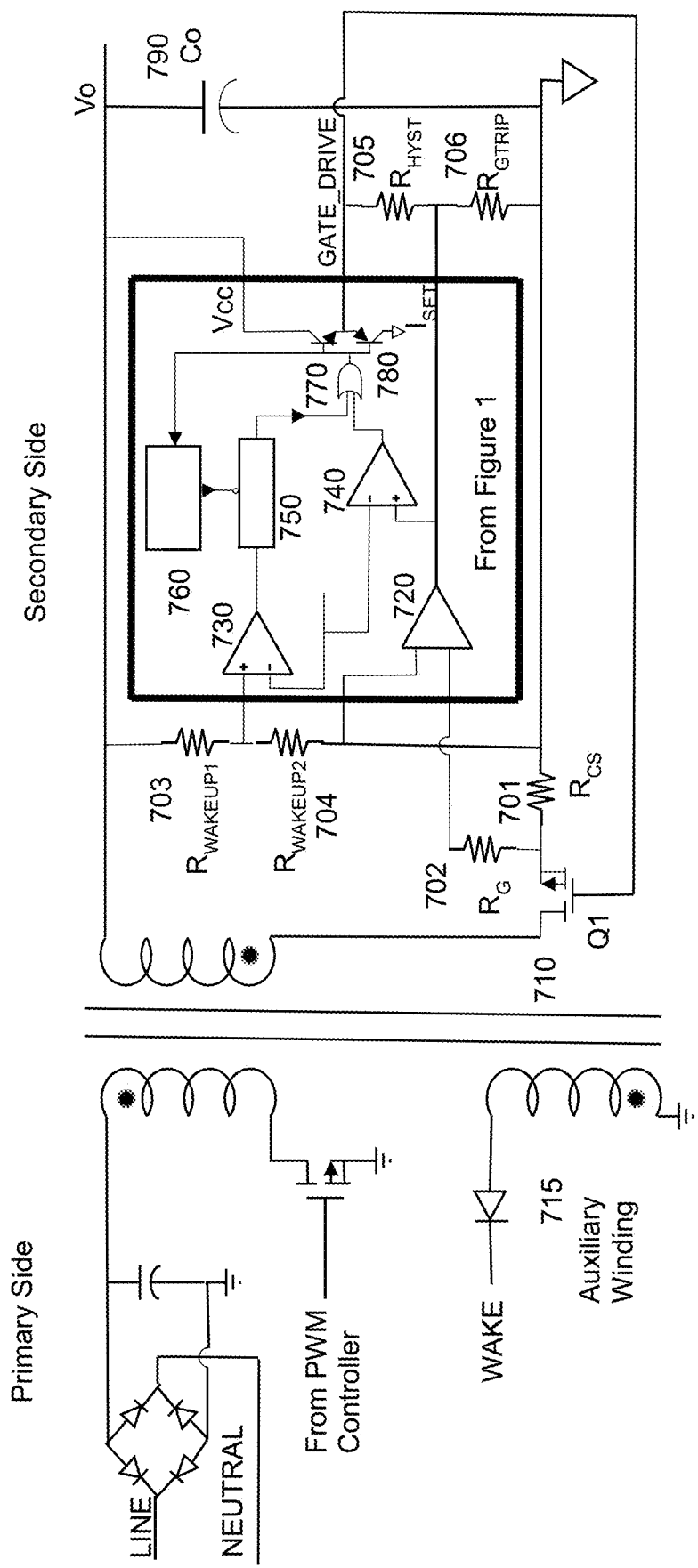
FIG. 7 depicts a schematic of an example flyback converter including an embodiment of a controller.

FIG. 7 depicts a simplified schematic of an example embodiment of a controller in an example flyback converter. The controller may synchronously control the switching of switch Q1 710 to charge the output capacitor Co 790 to provide an output voltage Vo. FIG. 7 further depicts an auxiliary winding 715 of the transformer which may sense the wake-up pulse generated by the wake-up circuitry to wake the flyback converter from a deep sleep mode in accordance with the description provided above.

Figure 8:
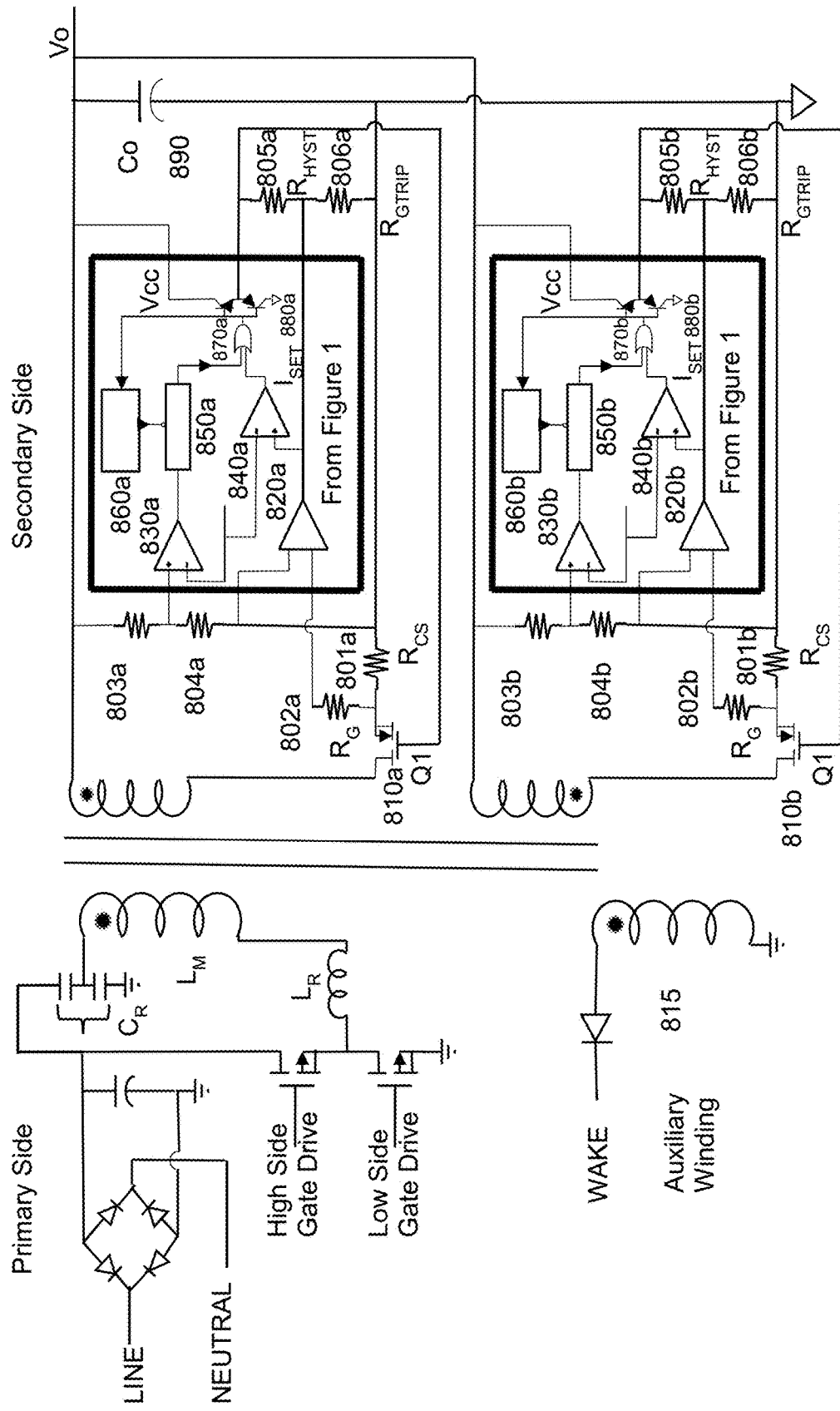
FIG. 8 depicts a schematic of an example LLC converter including an embodiment of a controller.

FIG. 8 depicts a simplified schematic of an example embodiment of a controller in an example LLC converter, wherein two controllers are implemented. The controllers may control the respective switches Q1 810a and 810b to charge the output capacitor Co 890 to provide an output voltage Vo. FIG. 8 further depicts an auxiliary winding 815 of the transformer which may sense the wake-up pulse generated by the wake-up circuitry to wake the flyback converter from a deep sleep mode in accordance with the description provided above.

While the various embodiments described and depicted may be shown by way of example using a particular topology or a particular device, one of ordinary skill in the art recognizes that alternatives fall within the spirit of teachings disclosed herein. For example, the schematics shown in FIGS. 5, 6, and 7 depict the use of bipolar transistors, but one of ordinary skill should readily recognize that FETs or other suitable non-linear devices may be used. Likewise, for example, while a resistor may be depicted, one of ordinary skill will readily understand that a diode, transistor, capacitor, inductance, or any other device suitable for providing resistance may be used.

While various embodiments of the disclosed controller have been described in detail, further modifications and adaptations of the embodiments may be apparent to those skilled in the art. It should be understood that such modifications and adaptations are within the spirit and scope of the present disclosure.

What is claimed is:

1. A voltage comparator, comprising:
a first NPN transistor, wherein a base of the first NPN transistor is coupled to an input voltage, wherein the input voltage changes over time;
a second NPN transistor, wherein a base of the second NPN transistor is coupled to a reference voltage through a resistor, wherein the resistor is coupled in parallel with a negative temperature coefficient thermistor, and wherein a positive temperature coefficient thermistor is coupled to the base of the second NPN transistor, and wherein an emitter of the second NPN transistor is coupled to an emitter of the first NPN transistor;
a first PNP transistor, a second PNP transistor, a third PNP transistor, and a fourth PNP transistor, wherein a base of the first PNP transistor is coupled to a collector of the first PNP transistor and is further coupled to a collector of the first NPN transistor and is even further coupled to a base of the second PNP transistor, an emitter of the first PNP transistor is coupled to a collector of the third PNP transistor, a collector of the second PNP transistor is coupled to a collector of the second NPN transistor, a base of the fourth PNP transistor is coupled to a collector of the fourth PNP transistor and is further coupled to an emitter of the second PNP transistor and is even further coupled to a base of the third PNP transistor;
a fifth PNP transistor; and
a third NPN transistor, wherein a base of the fifth PNP transistor is coupled to a base of the third NPN transistor and further coupled to the collector of the second NPN transistor.

2. The voltage comparator of claim 1, wherein the collector of the second NPN transistor is coupled to the base of the fifth PNP transistor and the base of the third NPN transistor through a resistor.

3. The voltage comparator of claim 1, wherein the base of the first NPN transistor is coupled to a positive input of the voltage comparator and wherein the base of the second NPN transistor is coupled to a negative input of the voltage comparator.

4. The voltage comparator of claim 1, wherein the positive temperature coefficient thermistor couples the base of the second NPN transistor to ground.

5. The voltage comparator of claim 4, wherein a change in resistance of the resistor is compensated by a PN junction.

6. The voltage comparator of claim 4, wherein a change in resistance of the resistor is compensated by a voltage controlled current.

7. The voltage comparator of claim 4, wherein a change in resistance of the resistor is compensated by a modified voltage across the resistor.

8. The voltage comparator of claim 1, further comprising a fourth NPN transistor and a fifth NPN transistor, wherein a collector of the fourth NPN transistor is coupled to the emitter of the first NPN transistor and to the emitter of the second NPN transistor, and wherein a base of the fourth NPN transistor is coupled to a base of the fifth NPN transistor and is further coupled to a collector of the fifth NPN transistor.

9. The voltage comparator of claim 8, wherein the collector of the fifth NPN transistor is coupled to a supply voltage.

10. The voltage comparator of claim 9, wherein the collector of the fifth PNP transistor is coupled to the supply voltage through a resistor.

11. The voltage comparator of claim 1, wherein an emitter of the third PNP transistor and an emitter of the fourth PNP transistor are coupled to a supply voltage.

12. The voltage comparator of claim 11, wherein a collector of the third NPN transistor is coupled to the supply voltage.

13. The voltage comparator of claim 1, wherein an emitter of the third NPN transistor is coupled to an emitter of the fifth PNP transistor, and wherein the emitter of the third NPN transistor and the emitter of the fifth PNP transistor are coupled to a logic OR gate input.

14. The voltage comparator of claim 1, further comprising a resistor coupled between the base of the first NPN transistor and the input voltage, wherein the input voltage is based on an output of a current controlled amplifier, and wherein an emitter of the third NPN transistor and an emitter of the fifth PNP transistor are coupled to an output of the voltage comparator, and wherein the output drives a first input of a logic OR gate.

15. The voltage comparator of claim 14, wherein a monostable drives a second input of the logic OR gate, and wherein the logic OR gate is configured to drive a gate of a switch.

* * * * *